US006806726B2

(12) United States Patent
Okada et al.

(10) Patent No.: US 6,806,726 B2
(45) Date of Patent: Oct. 19, 2004

(54) SEMICONDUCTOR INTEGRATED CIRCUIT

(75) Inventors: Hidehiro Okada, Tokyo (JP); Tetsuya Maruyama, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/747,446

(22) Filed: Dec. 30, 2003

(65) Prior Publication Data

US 2004/0150419 A1 Aug. 5, 2004

Related U.S. Application Data

(62) Division of application No. 09/763,495, filed as application No. PCT/JP99/04106 on Feb. 23, 2001, now Pat. No. 6,693,448.

(30) Foreign Application Priority Data

Aug. 24, 1998  (JP) ........................................... 10-237392

(51) Int. Cl.[7] ............................................. G01R 31/26
(52) U.S. Cl. ..................................... 324/765; 324/763
(58) Field of Search ................................. 324/765, 763, 324/158.1, 768, 769; 714/724, 733; 365/189.05, 734

(56) References Cited

U.S. PATENT DOCUMENTS 5,097,206 A    3/1992   Perner
5,592,494 A *  1/1997   Nozuyama ................... 714/733
5,929,650 A *  7/1999   Pappert et al. ............... 324/763
6,101,623 A    8/2000   Nozuyama
6,144,214 A * 11/2000   Athan ......................... 324/763
6,151,694 A   11/2000   Nozuyama

FOREIGN PATENT DOCUMENTS

| JP | 03120859 | 5/1991  |
|----|----------|---------|
| JP | 04290975 | 10/1992 |
| JP | 05326870 | 12/1993 |
| JP | 07037958 | 2/1995  |
| JP | 09101347 | 4/1997  |

* cited by examiner

Primary Examiner—David A. Zarneke
Assistant Examiner—Tung X. Nguyen
(74) Attorney, Agent, or Firm—Antonelli, Terry, Stout & Kraus, LLP

(57) ABSTRACT

A semiconductor integrated circuit is segmented into a plurality of blocks. Each block includes a switching transistor which is connected between the CMOS circuit of the block and the ground point and is adapted to shut off the current of the CMOS circuit by being controlled by a test mode control signal, and a leakage current detecting circuit which has a self-check function for the block. A signal which is the logical sum of the outputs of the leakage current detecting circuits of all blocks is the led out of the semiconductor integrated circuit through a common external output terminal.

6 Claims, 9 Drawing Sheets

SEMICONDUCTOR INTEGRATED CIRCUIT

CROSS-REFERENCE TO RELATED APPLICATIONS

This application is a Divisional application of application Ser. No. 09/763,495, Feb. 23, 2001, now U.S. Pat. No. 6,693,448, which is a national stage application, filed under 35 U.S.C. § 371, of International (PCT) Application No. PCT/JP99/04106, filed Jul. 30, 1999. The contents of application Ser. No. 09/763,495, filed Feb. 23, 2001, are incorporated wherein by reference in their entirety.

TECHNICAL FIELD

The present invention relates to the technology of semiconductor integrated circuits, and, more particularly, to a technique which can be applied effectively to the measurement of leakage current in a semiconductor integrated circuit, and, even more particularly, to a technique which is useful for the measurement of leakage current of a CMOS integrated circuit.

BACKGROUND OF THE INVENTION

For the detection of short-circuiting or breakdown of the pn junction of a semiconductor integrated circuit and the detection of breakdown of the gate insulation film of a MOSFET, a leakage current which is caused by these events is measured. A CMOS circuit has no or a very small load current in its inactive state, and, accordingly, the presence or absence of a leakage current can be determined by applying a voltage thereto and measuring the load current.

However, due to the trend toward higher circuit integration, a lower threshold signal level and a higher chip temperature resulting from a lower operating voltage, the load current of a MOSFET in the inactive state has increased, making it difficult to discriminate a leakage current, and, consequently it has become difficult to measure the leakage current accurately in the conventional manner based on voltage application and load current measurement.

Japanese Patent Unexamined Publication No. Hei 9(1997) - 101347 describes a technique which resembles and precedes the present invention. FIG. 11 of the accompanying drawings shows a representative example of the above-referenced technique, which is intended to find a circuit having a leakage current based on the following circuit arrangement. The internal circuit is segmented into multiple blocks, and the blocks (inner circuits a1–a5) are provided on their power voltage $V_{DD}$ side with switching MOSFETs S1–S5 which can be turned on or off selectively in response to control signals received on the external terminals (pads) P1–P5. The blocks (inner circuits a1–a5) are further provided on their ground voltage GND side with a leakage current lead-out circuit 21, which is formed of a transistor 27 and a current mirror circuit (29, 31), for shutting off the load current of the inner circuits upon detection of a leakage current. The circuit arrangement includes a leakage current detecting circuit which is formed of a reference current generation circuit 17 connected in series to one transistor of the current mirror circuit and an inverter 19 which is adapted to compare the leakage current flowing through the leakage current lead-out circuit 21 with the reference current provided by the reference current generation circuit 17.

Although this technique is capable of finding a circuit having a leakage current, this "tandem circuit arrangement" having the MOS transistors connected on the power voltage $V_{DD}$ side and ground voltage GND side makes the supply voltage of the inner circuits lower than the power supply voltage on the chip terminal. On the other hand, a power supply voltage at a certain voltage level or higher is needed for the normal operation of the inner circuits. For this reason, the circuit arrangement cannot be fully adaptive to the trend toward provision of a lower power voltage for the semiconductor integrated circuits. Moreover, if the reference current generation circuit 17 or inverter 19 used in the leakage current lead-out circuit and leakage current detecting circuit fails, a leakage current cannot be detected or will be detected erroneously.

Although the above-referenced technique also is applicable to an embodiment (FIG. 11 of the above-mentioned patent publication) including a leakage current detecting circuit for each segmented inner circuit, a leakage current detecting circuit having two MOS transistors in tandem connection (FIG. 12 of the above-mentioned patent publication) cannot be fully adaptive to the trend toward provision of a lower power supply voltage for the semiconductor integrated circuits.

It is an object of the present invention to provide a technique for the testing of semiconductor integrated circuit which capable of detecting easily and accurately the presence or absence of a leakage current in excess of a specified amount in a CMOS integrated circuit chip.

Another object of the present invention is to provide a technique for a semiconductor integrated circuit which is capable of detecting a leakage current even in the case of a low-voltage design.

Still another object of the present invention is to provide a technique for a semiconductor integrated circuit which is capable of detecting an abnormality in a leakage current detecting circuit.

These and other objects and novel features of the present invention will become apparent from -the following description taken in conjunction with the accompanying drawings.

SUMMARY OF THE INVENTION

Among the aspects of the present invention disclosed in this specification, representative features are summarized as follows.

A semiconductor integrated circuit is segmented into multiple blocks, and each block comprises a plurality of CMOS circuits connected between one (e.g., ground point) of at least two potential points (power voltage $V_{DD}$ and ground potential) and a respective switching transistor, which can be controlled by a test mode control signal to shut off the current flowing through each CMOS circuit; each block is and also provided with a leakage current detecting circuit, with a signal resulting from the logical sum of the outputs of all leakage current detecting circuits of the multiple blocks being led out of the semiconductor integrated circuit through an external output terminal common to all blocks. The leakage current detecting circuit is arranged so that it can implement the detection of an abnormality in the leakage current detecting circuit itself (self check) and the output of the detection result.

The leakage current detecting circuit with the ability of self check is conceivably a combined circuit including a switching circuit which can connect the circuit in the block to a common constant current source, a potential detecting circuit which is formed of an inverter and the like and designed to detect the potential of an arbitrary node on the current path of the constant current source and have its output varied in response to a leakage current larger than a certain value, a means of supplying a pseudo leakage current to the constant current source, and a current path switching means which is connected to the output terminal of the potential detecting circuit and is adapted to switch between the pulling and pushing of a current from/to the output terminal depending on the control mode.

The above-mentioned means can detect easily and accurately whether or not a leakage current more than a specified amount is flowing through the CMOS integrated circuit by merely checking a specific external output terminal. Based on the design which calls for leading out the signal resulting from the logical sum of the outputs of leakage current detecting circuits of all blocks through the common external output terminal, the increase in the number of external terminals can be minimized.

Based on the provision of the switching transistor connected between the CMOS circuit of each block and one potential point (e.g., ground point) so as to shut off the current flowing through the CMOS circuit under control of the test mode control signal, the number of transistors in tandem connection in each block can be reduced, which is advantageous to the trend toward use of a lower power supply voltage for semiconductor integrated circuits.

In an alternative design, instead of leading out the signal resulting from the logical sum of the outputs of all leakage current detecting circuits through the common external output terminal, a selector circuit is provided between the output terminals all leakage current detecting circuits and the common external output terminal so that the detection signal of each leakage current detecting circuit is led out selectively. This arrangement, which can determine a block having a leakage current, is advantageous in facilitating the fault analysis.

Based on the provision of the means to supply a pseudo leakage current to the constant current source and the current path switching means which switches between the pulling and pushing of a current from/to the output terminal of the potential detecting circuit depending on the control mode, it becomes possible to detect an abnormality in a leakage current detecting circuit itself and/or the low-stuck fault (fixed to the ground voltage) of the wiring for the logical sum of the leakage current detecting circuits and of the output terminal.

BEST MODE FOR CARRYING OUT THE INVENTION

Preferred embodiments of the present invention will be explained with reference to the drawings.

Figure 1:
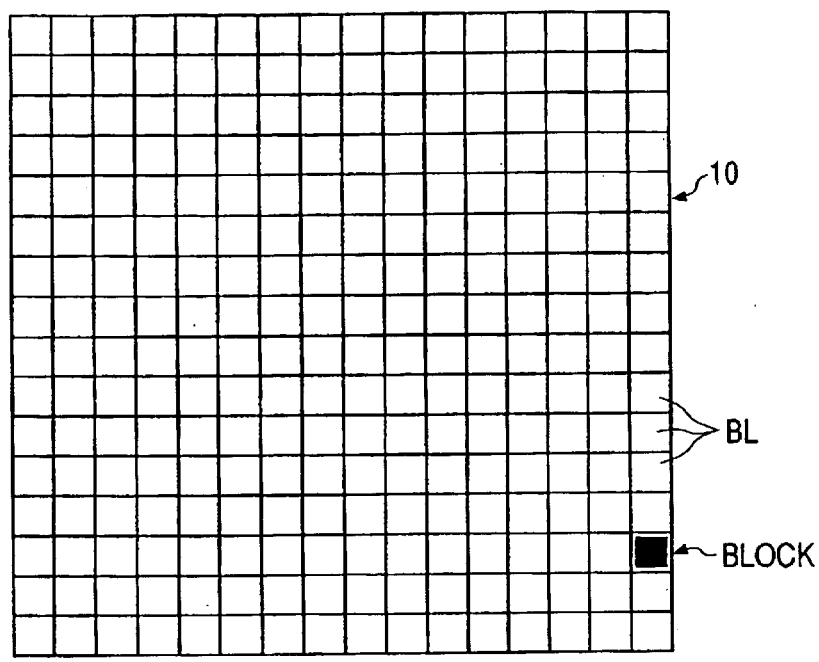
FIG. 1 is a conceptual diagram showing the arrangement of the whole LSI chip representing a first embodiment of a CMOS-LSI based on the present invention.
Figure 2:
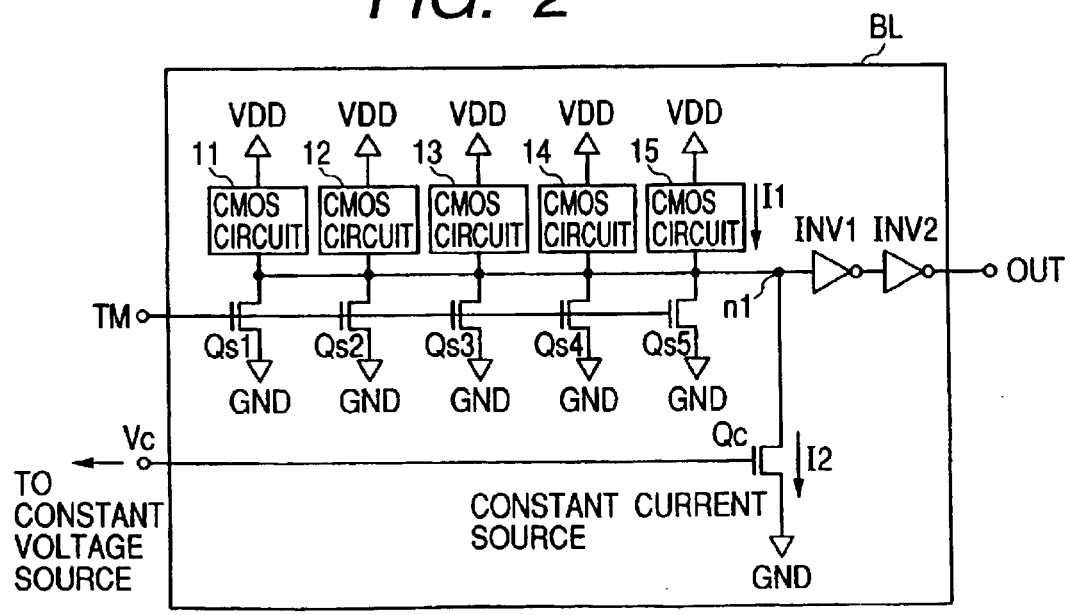
FIG. 2 is a block diagram showing an embodiment of the leakage current detecting circuit in each segment block.
Figure 3:
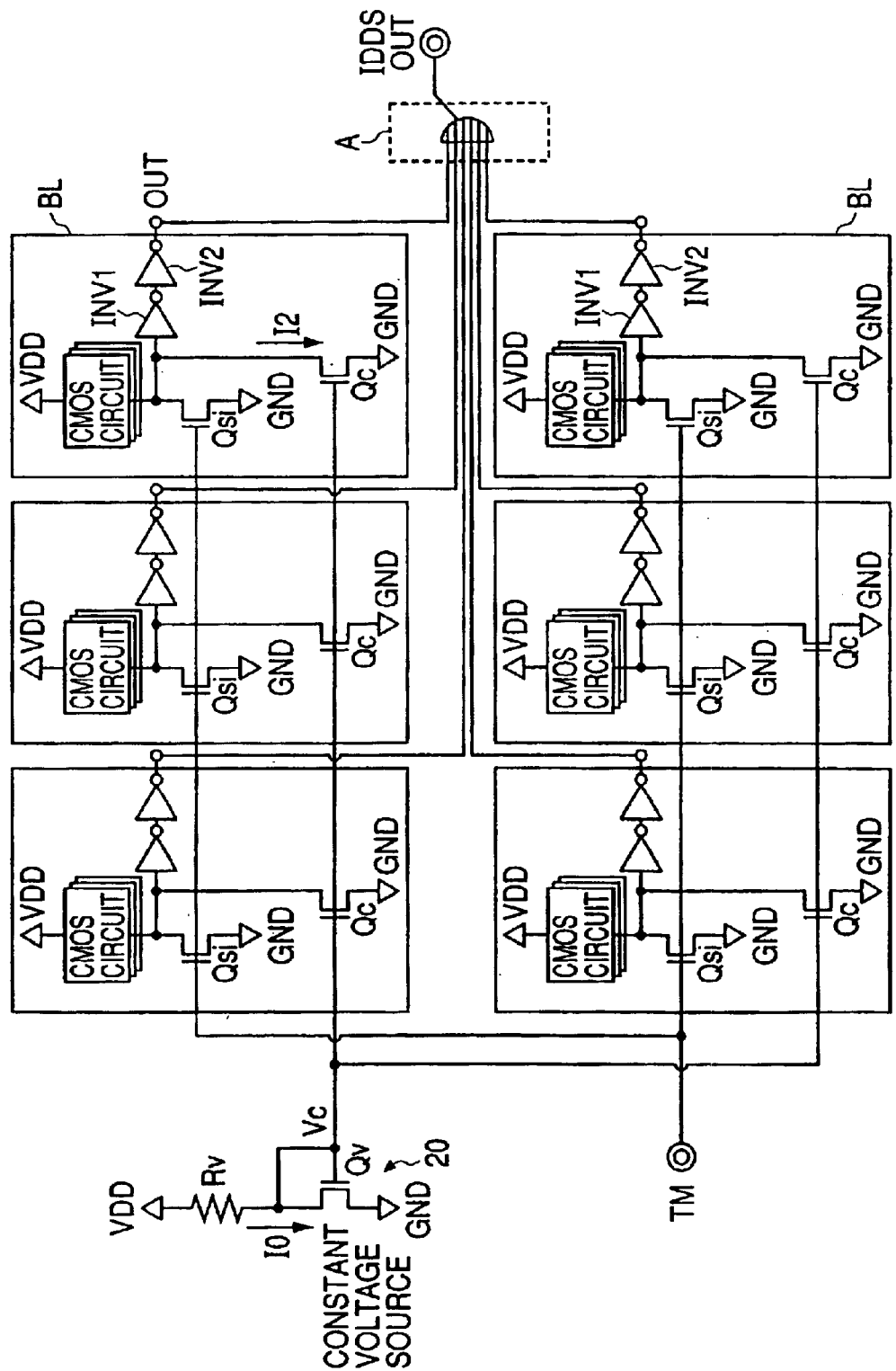
FIG. 3 is a block diagram showing an example of the relation between the leakage current detecting circuits in the segment blocks and the external output terminal.

FIG. 1 through FIG. 3 show the first embodiment of a CMOS-LSI, to which the present invention is applied. An entire LSI chip 10 is segmented into multiple blocks BL as shown in FIG. 1. Each segment block is arranged as shown in FIG. 2. FIG. 3 shows the relation among the segment blocks. Although FIG. 1 shows even segmentation of the inside of the LSI to yield segment blocks BL of the same size, it is not necessary for all blocks to have the same size. Instead, the inside of LSI may be divided into functional blocks.

The manner of segmentation into functional blocks may involve either dividing the LSI into large blocks or small blocks. As a manner of division into large blocks, a system LSI, for example, is divided into a CPU (central processing unit), a memory circuit, such as a ROM (read-only memory) and a RAM (random access memory), an arithmetic unit for high-level arithmetic operations, such as multiplication, a DMA controller, an interrupt controller, an analog-to-digital conversion circuit, a serial communication interface circuit, and a timer circuit.

A manner of division of the LSI into small functional blocks can involve division into registers, counters, operation circuits for simple calculations, such as addition and subtraction, selector circuits, multiplexers, and decoders. In the case of division into large blocks, each functional block may be assumed to be a CMOS circuit as shown in FIG. 2, which is provided with a leakage current detecting circuit.

For minimizing an increase in the area of occupation, it is desirable to make each block consist of as a large circuit as possible provided that a leakage current can be detected depending on the arrangement and operation of the detecting circuit to be adopted. From the viewpoint of the easiness of design of the leakage current detecting circuit, segmentation is designed so that leakage currents are virtually equal among all blocks.

Next, the arrangement of one segment block resulting from the division in a proper size as described above will be explained in connection with FIG. 2. In FIG. 2, reference numerate 11 through 15 denote CMOS circuits which are made up of p-channel MOSFETs and n-channel MOSFETs in serial connection to form logic function blocks, such as NOR gates, AND gates, inverters and latch circuits, and are designed to have virtually no load current when their input signals are unchanged. Usually, the CMOS circuits have their power terminals connected to the power voltage VDD and ground point GND; whereas, in this embodiment of invention, there are connected, between the CMOS circuits 11–15 and the ground point GND, current shut-off switching MOSFETs Qs1–Qs5, which receive a test mode control signal TM on their gate terminals. In this specification, in term MOSFET signifies generically an electric-field effect transistor of the insulated gate type.

These MOSFETs Qs1–Qs5 have their drains connected to a common MOSFET Qc. The MOSFET Qc operates as a constant current source by being supplied at its gate terminal with a constant voltage Vc from a constant voltage source. The constant current sourcing MOSFET Qc has a current capacity greater than the allowable leakage current of the CMOS circuits 11–15.

Connected at the node n1 of the MOSFETs Qs1–Qs5 and the constant current sourcing MOSFET Qc is the input terminal of an inverter INV1, which is connected in series at its output terminal to another inverter INV2. The switching MOSFETs Qs1–Qs5, constant current sourcing MOSFET Qc, and inverters INV1 and INV2 in unison constitute a leakage current detecting circuit.

In this embodiment, the constant current sourcing MOSFET Qc has its gate width adjusted to determine the current 12 flowing through the CMOS circuits 11–15 of the block, and the inverter INVL has its threshold level adjusted so that its output is at the low level when the load current 11 of the whole block is more than a certain value, on the condition that the switching MOSFETs Qs1–Qs5 are off and the input signals of the CMOS circuits 11–15 are unchanged.

A way of ensuring that the input signals of the CMOS circuits 11–15 will be unchanged is to pull the input terminals or common input/output terminals of the LSI to the power voltage or ground voltage level, for example. Another way for an LSI having an external operation clock signal to gate out the clock input.

In this embodiment, the inverter INV2 has a low-level output when the leakage current of the whole block is smaller than a certain value, and the output turns to the high level when the leakage current is larger than the certain value. Accordingly, the presence or absence of a leakage current can be determined easily by checking the output of the inverter INV2. In addition, by designing the gate width of the constant current sourcing MOSFET Qc independently for each block depending on its allowable leakage current, it becomes possible to set a leakage current value depending on the size of the block.

In this embodiment, a constant voltage source 20, which provides the bias voltage Vc for the constant current sourcing MOSFET Qc of each block, is made up of a MOSFET Qv in diode connection having its gate and drain connected together and a resistor Rv connected on the drain side of Qv, as shown in FIG. 3, and the constant current sourcing MOSFET QC provided in each block is in current mirror connection with the MOSFET Qv of the constant voltage source 20.

Accordingly, by setting the ratio n of the gate widths of Qc and Qv appropriately, the constant current sourcing MOSFET Qc can have a current that is n times the current IO flowing through the MOSFET Qv of the constant voltage source 20. In consequence, by adjusting the gate width of the constant current sourcing MOSFET Qc of each block, it is possible to set a threshold leakage current depending on the size of each block. Otherwise, block division may be designed so that threshold leakage currents are virtually equal among all blocks, in which case the leakage current detecting circuits of all blocks can have an equal sensitivity.

In this embodiment, as shown in FIG. 3, the outputs of the inverters INV2 of all blocks in the LST are connected to produce a wired-OR logic output, and the resulting signal is led out through the external output terminal IDDSOUT. Accordingly, by measuring the signal on the IDDSOUT terminal, while turning off the switching MOSFETs Qsi in all blocks using the control signal TM, it is possible to detect the presence of leakage current in one block.

Generally, a product in the form of a semiconductor integrated circuit having a leakage current in one segment is judged to be a faulty product at the time of the product selection test; and, therefore, there is no problem in leading out the signal of the wired-OR logic of the outputs of the inverters in all blocks through a common external output terminal IDDSOUT, and it is rather advantageous from the point of view of reduction of an number of external terminals through provision of a common terminal for the output of the detection result. Moreover, this embodiment uses a common external terminal for the input of the test mode control signal and a common constant voltage source 20 for driving the constant current sourcing MOSFETs Qc, which is advantageous from the point of view of prevention of an increase in the chip size.

This embodiment is designed to form the constant voltage source 20 inside the same chip, and it is supplied with the power supply voltage VDD only in the test mode set by the test mode control signal TM for leakage current detection.

An alternative arrangement involves providing a selector circuit in the section of FIG. 3 enclosed by the dashed line A. The selector circuit in such use is controlled to lead out the results of leakage current detection (outputs of the inverters INV2) of all blocks sequentially, thereby indicating a block having a leakage current. This is a useful function for the analysis of an LSI fault.

Figure 4:
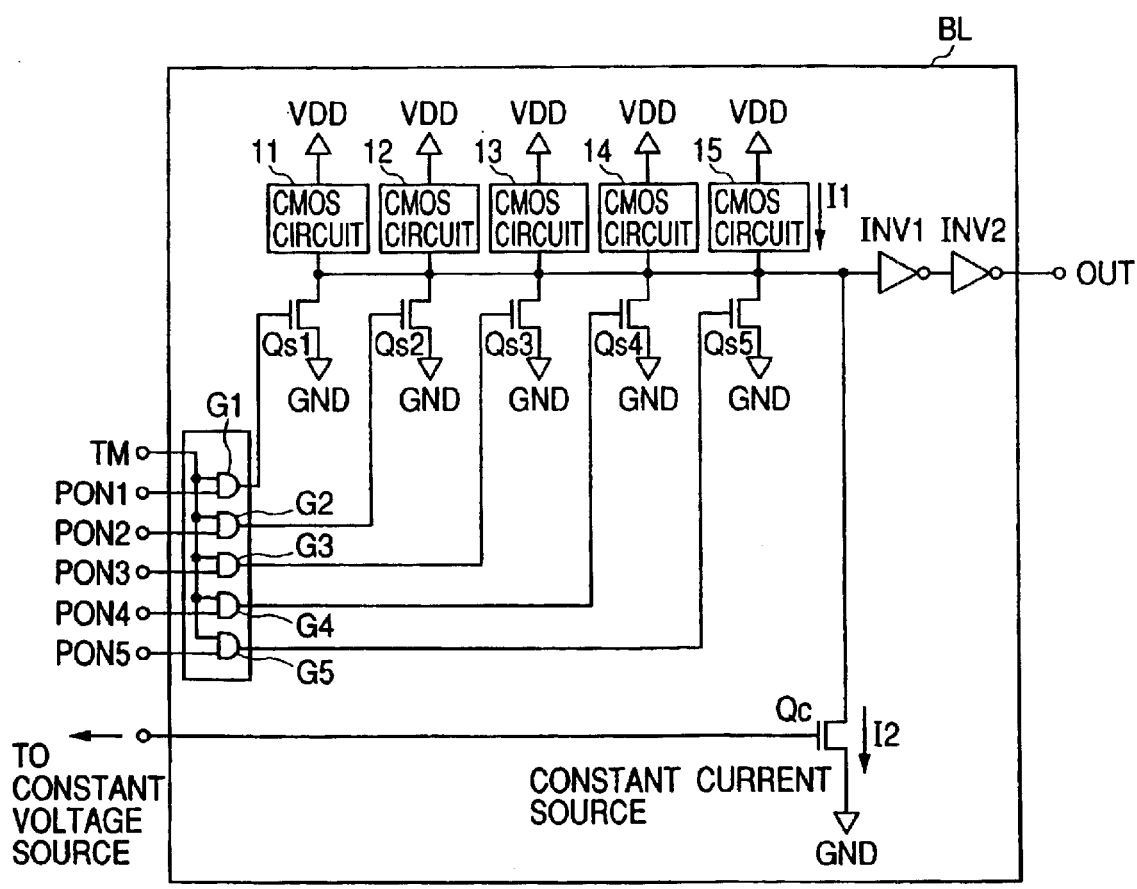
FIG. 4 is a block diagram showing a variant of the embodiment of FIG. 2.

FIG. 4 shows a variant of the embodiment of FIG. 2.

This embodiment is derived from the embodiment of FIG. 2, with the main difference being that, instead of applying the test mode control signal TM directly to the gate terminals of the switching MOSFETs Qs1–Qs5, which are provided between the CMOS circuits 11–15 and the ground potential, to shut off the currents of the CMOS circuits at the time of testing, the gate terminals are supplied with the output signals of AND gates G1–G5, which take a logical product between the test mode control signal TM and the operation control signals PON1–PON5. The operation control signals PON1–PON5 may be supplied from the outside of the chip through external terminals (pads), or they may be produced and supplied by other functional blocks within the chip, or supplied from a register which is provided for controlling the MOSFETs Qs1–Qs5.

In this embodiment, when the test mode control signal TM becomes low level at the time of the leakage current detection test, all AND gates G1–G5 produce low-level outputs to turn off all switching MOSFETs Qs1–Qs5. Consequently, it becomes possible to carry out the same leakage current test as that of the embodiment of FIG. 2.

During normal operation, in which the test mode control signal TM is at has the high level, operation control signals PON1–PON5 turn off corresponding switching MOSFETs Qs1–Qs5 of CMOS circuits 11–15 to shut off their operating currents, thereby halting the operation of the circuits selectively. Accordingly, this embodiment may be applied effectively with the intention of saving the power consumption by halting the operation of some CMOS circuits in a system LSI or the like having a standby mode. This arrangement enables the reduction of power consumption of the LSI and the reduction of the circuit area being occupied, thereby to minimize an increase of the chip size as compared with the case of providing the current shut-off switches of the leakage current detecting circuits separately for all circuits.

This embodiment is also useful for an LSI which is designed to replace a memory array having defects with a spare memory array with the intention of enhancing the yield the products, in which case the memory array in which defects are found is deactivated by shutting off the current.

Figure 5:
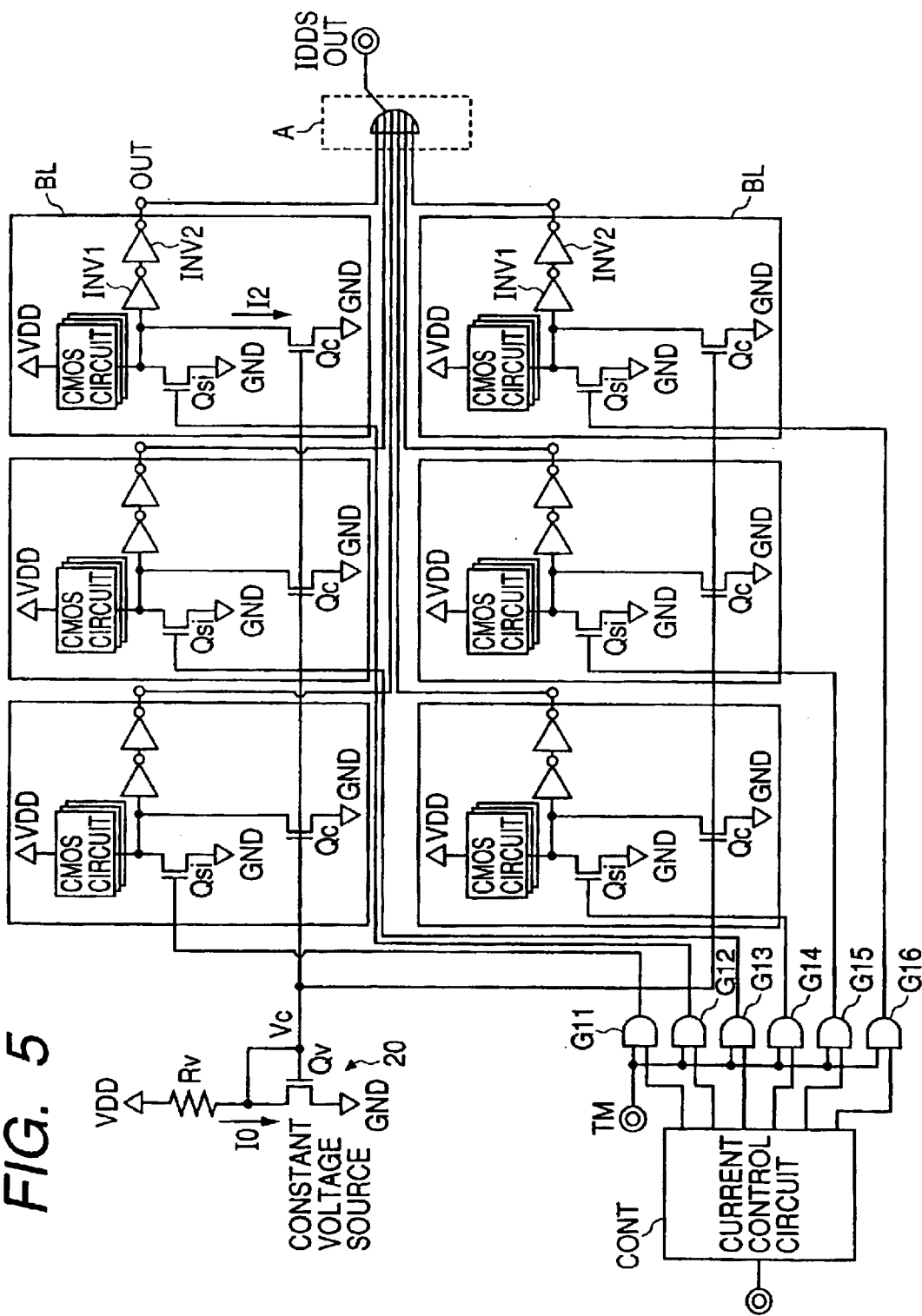
FIG. 5 is a block diagram showing a variant, in the same sense as FIG. 4, of the embodiment of FIG. 3.

FIG. 5 shows an example representing another variant derived from the embodiment of FIG. 3 and is similar to the embodiment of FIG. 4.

This embodiment is designed to alter the direct application of the test mode control signal TM to the gate terminals of the switching MOSFETs Qsi which are provided for all functional blocks in the embodiment of FIG. 3 for shutting off the block currents at the time of testing; and, instead, the output signals of AND gates G11–G16, which take a logical product between the test mode control signal TM and control signals provided by a current control circuit CONT, are applied to the gate terminals. This embodiment, as in the case of the embodiment of FIG. 4, can save the power consumption by shutting off the block current on a block-by-block basis in the standby mode or the like.

The current control circuit CONT is formed of a register which belongs to another functional block within the chip and has its content set through an external terminal (pad) of the chip, or it may be formed of a decoder or the like which decodes a selection signal supplied from the outside of the chip.

Figure 6:
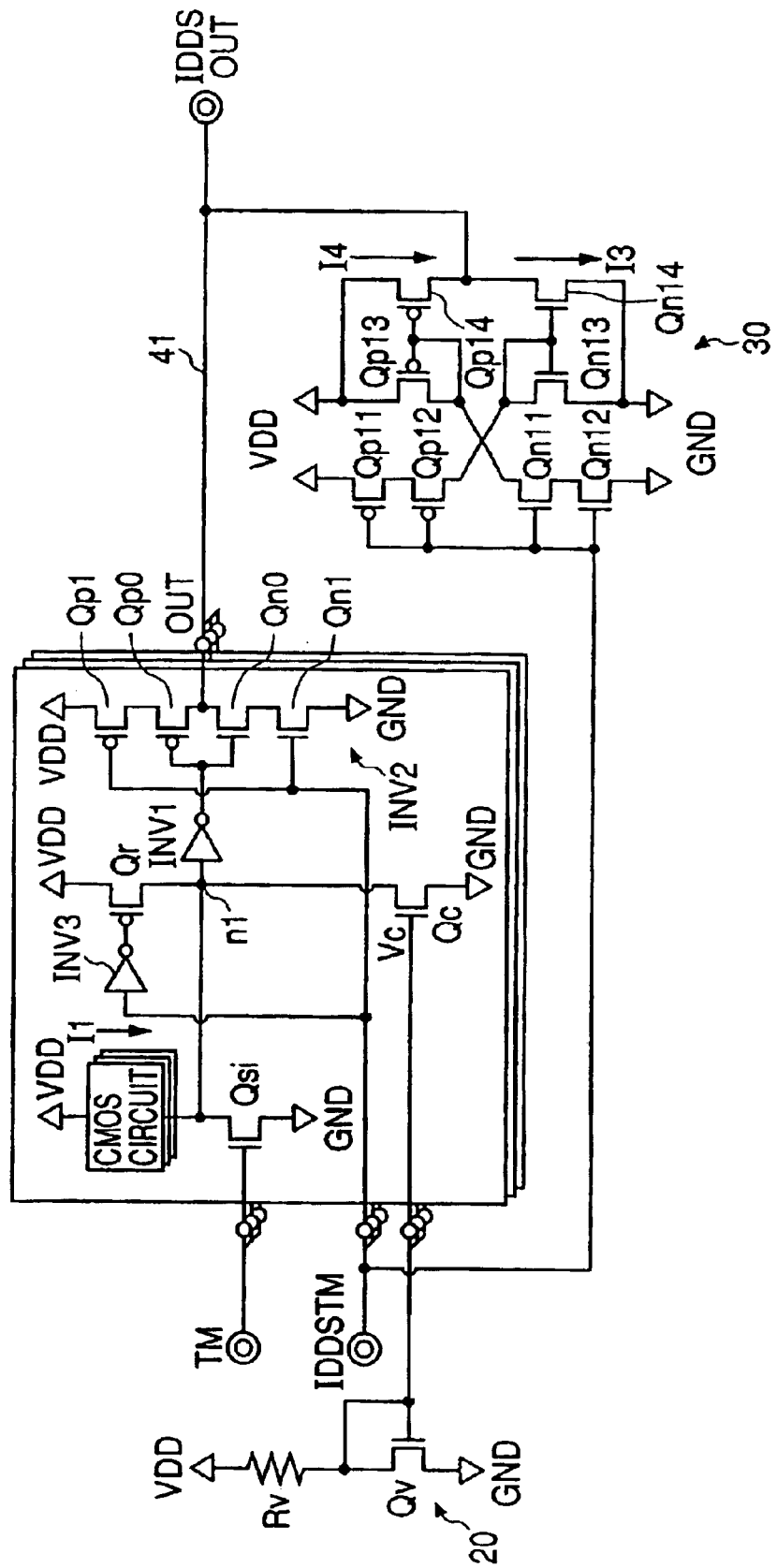
FIG. 6 is a block diagram showing another embodiment of the leakage current detecting circuit in the block.

FIG. 6 shows an embodiment having an additional self-check circuit which verifies the normality of the function of leakage current detecting circuit of the preceding embodiment provided for each block. In FIG. 6, MOSFETS with the symbol of a small circle being attached to their gate are of the p-channel type and those without this symbol are of the n-channel type.

In this embodiment, a MOSFET Qr, which is adapted to conduct a pseudo leakage current, is connected between the node nI, at which the leakage current detecting inverter INVL detects a potential, and the power voltage VDD in each block. The output inverter INV2 is designed to be of the clocked-inverter type, and MOSFETs Qp1 and Qn1 for controlling this inverter have their gate terminals supplied with a control signal IDDSTM, which turns the leakage current detecting circuit to the function test mode. An inverted version of the control signal IDDSTM produced by another inverter INV3 is applied to the gate terminal of the pseudo leakage current conducting MOSFET Qr.

This embodiment further includes a current path switching circuit 30, which is connected in common to the output terminals OUT of the leakage current detecting circuits of the multiple blocks. The current path switching circuit 30 is made up of p-channel MOSFETs Qp11 and Qp12 in serial connection, having the application of the control signal IDDSTM on their gate terminals, n-channel MOSFETs Qn11 and Qn12 in serial connection, an n-channel MOSFET Qn13 connected in series to the MOSFET Qp12, a p-channel MOSFET Qp13 connected in series to the MOSFET Qn12, a p-channel MOSFET Qp14 in current-mirror connection with the MOSFET Qp13, and an n-channel MOSFET Qn14 in current-mirror connection with the MOSFET Qn13.

The current flowing through the pseudo leakage current conducting MOSFET Qr is designed to be larger than the current flowing through the constant current sourcing MOSFET Qc, although this condition is not compulsory. The current flowing through the constant current sourcing MOSFET Qc is designed to be larger than the allowable leakage current I1 of the CMOS circuit.

Figure 7:
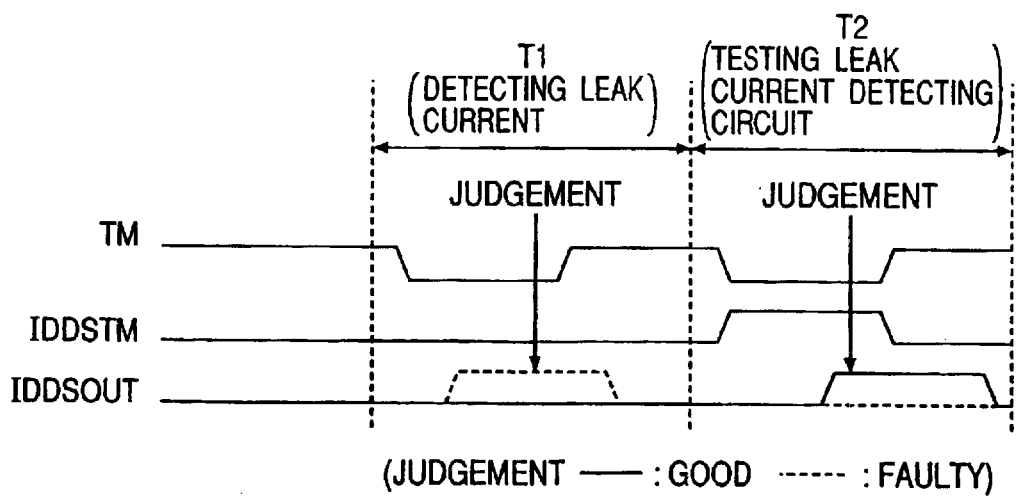
FIG. 7 is a timing chart showing the control timing of the leakage current detecting circuit of the embodiment of FIG. 6.

In the circuit of this embodiment, when the control signal TM is brought to the low level in the state of a low-level control signal IDDSTM, as shown at TI in FIG. 7, the MOSFETs Qr and Qsi turn off, causing the leakage current II of the CMOS circuits 11–15 to flow through the constant current sourcing MBSFET Qc. At this time, in the current path switching circuit 30, receiving a low-level control signal IDDSTM, the MOSFETs Qn11 and Qn12 are in the off state and the MOSFETs Qp11 and Qp12 are in the on state. Consequently, a current I3 flows through the MOSFETs Qn13 and Qn14, which are connected to the MOSFETs Qp11 and Qp12, and the output terminal IDDSOUT is normally pulled to the low level.

If a leakage current I1 in excess of a certain amount flows in the CMOS circuit 11–15, causing the potential at the node n1 to rise over a certain level, the inverter INVL turns its output to the low level. At this time, the MOSFET Qpi is on due to the control signal IDDSTM, causing the inverter INV2 to produce a high-level output, resulting in virtually the same operation as the leakage current detecting circuit of the embodiment of FIG. 2.

In the circuit of this embodiment, on the other hand, when the control signal TM is brought to the low level in the state of a high-level control signal IDDSTM, as shown at T2 in FIG. 7, the MOSFETs Qr and Qni turn on and the MOSFETs Qsi and Qpi turn off, causing a pseudo leakage current to flow from the MOSFET Qr to the constant current sourcing MOSFET Qc even in the absence of a leakage current I1 in the CMOS circuits 11–15. At this time, in the current path switching circuit 30, receiving a high-level control signal IDDSTM, the MOSFETs Qn11 and Qn12 are in the on state and the Qp11 and Qp12 are in the off state. Consequently, a current I3 flows through the MOSFETs Qp13 and Qp14, which are connected to the MOSFETs Qn11 and Qn12, and the current I3 is shut off.

If the leakage current detecting circuit is normal, the inverter INVL produces a low-level output in response to a leakage current of all blocks in excess of a certain amount, causing the MOSFETs QpO and QnO to turn on and off, respectively, in the inverter INV2. Since the MOSFET Qp1 of the inverter INV2 is off, then due to the control signal IDDSTM as mentioned previously, the inverter INV2 has its output node in a high-impedance state. Consequently, the output terminal IDDSOUT is brought to high-level by the current I4 of the current path switching circuit 30.

Otherwise, if a wire 41 between the output node of the inverter INV2 and the output terminal IDDSOUT is short-circuited to the ground potential, the current I4 of the current path switching circuit 30 flows to the ground potential through the point of the short-circuit. Accordingly, the output terminal IDDSOUT does not become high level, which is detected from the outside by checking this terminal to determine that the leakage current detecting circuit is faulty (low-stuck fault).

In the case of a fault where the inverter INVL stays at a high-level output (output high-stuck fault), the inverter INV2 has its MOSFET QnO turned on. At this time, the MOSFET Qn1 is on due to the control signal IDDSTM, causing the current I4 flowing out of the current path switching circuit 30 to flow to the n-channel MOSFETs of the inverter INV2. Consequently, the output terminal IDDSOUT does not become high level, which is detected in the same manner as the output terminal low-stuck fault described above.

Furthermore, the inverter INVL has a high-level output at the time of testing when the gate terminal of the MOSFET Qsi which shuts off the block current, is short-circuited to the power voltage VDD, i.e., in the case of a high-stuck fault, or when the input terminal of the inverter INVL is short-circuited to the ground potential, i.e., in the case of a low-stuck fault, causing the output terminal IDDSOUT to stay at the low level, and these faults can be detected in the same manner as the output high-stuck fault of the inverter INV1.

In this manner, this embodiment can detect most faults of the leakage current detecting circuit based on the provision of a pseudo leakage current conducting MOSFET Qr and a current path switching circuit 30.

However, the foregoing arrangement is not capable of detecting a breakage, i.e., open fault, of the wire 41 which connects the output node of the inverter INV2 to the output terminal IDDSOUT, and a fault of the current path switching circuit 30. These faults, however, can be reduced to the extent of a negligible probability of occurrence by the provision of a plurality of inverters INV2, current path switching circuits 30 and output terminals IDDSOUT for each block. Providing multiple sets of these circuits results in an extremely small probability of faults of all circuit sets and enables the detection of a fault of the leakage current detecting circuit based on at least one normal circuit set.

Figure 8:
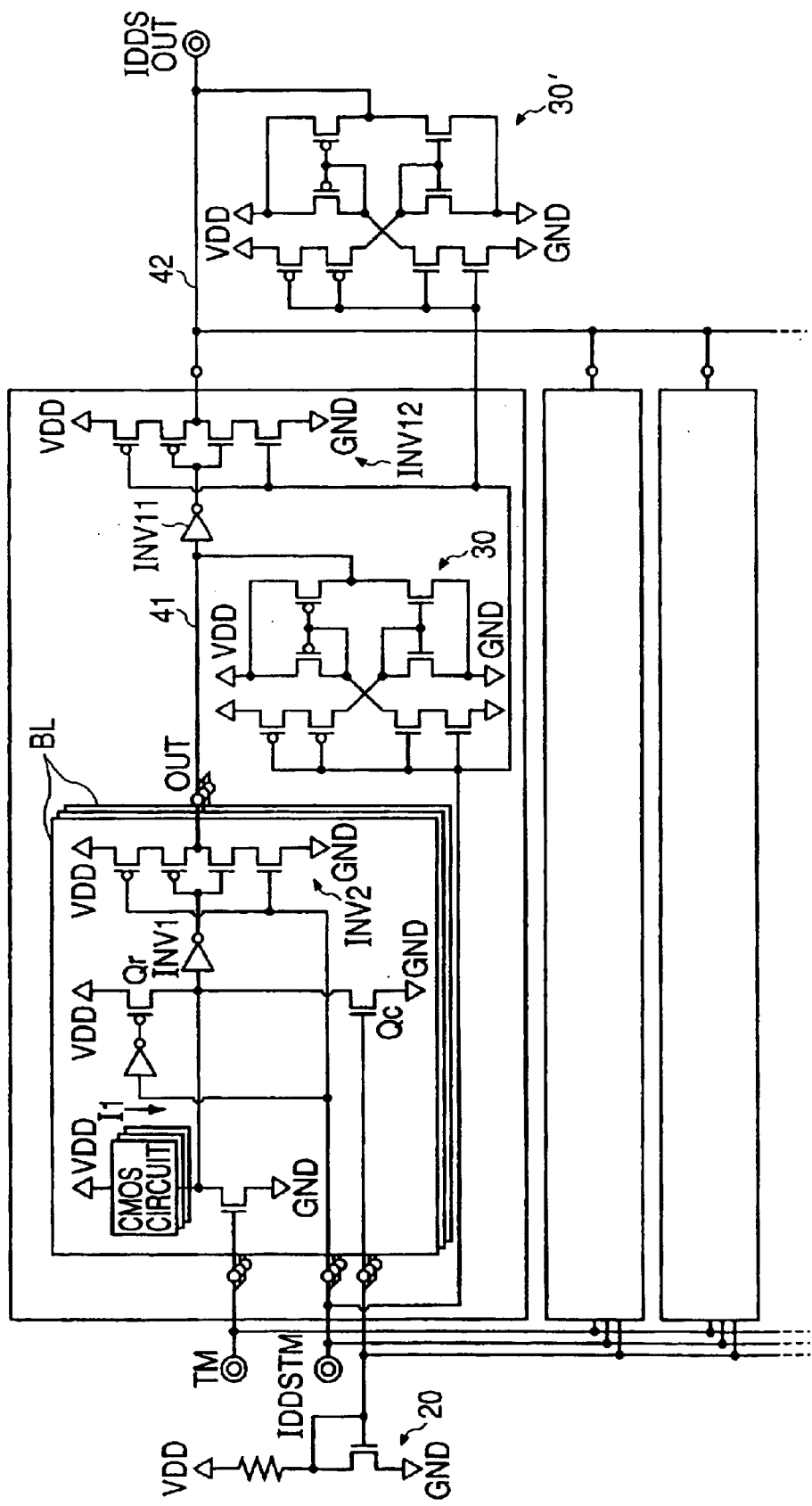
FIG. 8 is a block diagram showing another embodiment of a CMOS-LSI based on the present invention.

FIG. 8 shows another embodiment of a CMOS-LSI, with the present invention being applied thereto. This embodiment is an advanced version of the embodiment of FIG. 6 and is particularly useful for large-scale CMOS-LSIs having gates of several hundred thousands or more. In the case of an arrangement in which the detect signals from leakage current detecting circuits of all functional blocks are sent to the common detection result output terminal IDDSOUT, the average distance of signal lines from the functional blocks to the output terminal and the number of signal lines increase in proportion to the number of functional blocks of a huge LS1. The above-mentioned wired-OR logic of the output nodes increases the load an the output inverter INV2, resulting unfavorably in a slower detection speed.

For coping with this matter, there is devised a buffer formed of several stages of inverters on the output signal route from the leakage current detecting circuits to the output terminal IDDSOUT. However, an increased number of inverters will impose a problem of a fault of the inverter itself. This embodiment is designed to include inverters INV11 and INV12 for the buffer and a current path switching circuit 30 on the output signal route for each group of several functional blocks in the LSI, and further include a common current path switching circuit 30' provided for a plurality of the inverters INV11 and INV12 for the buffer so as to build a hierarchical self check circuit, thereby enhancing the detection speed.

Also, in this embodiment, as for the inverter INV2 of the embodiment of FIG. 6, the rear-stage buffering inverter INV11 is a clocked inverter having control MOSFETs Qp11 and Qn11, with the test mode control signal IDDSTM being applied to the gate terminals of the MOSFETs Qp11 and Qn11.

The checking function of the current path switching circuit 30' of this embodiment for the buffering inverters INV11 and INV12 and the wire 42 to the output terminal IDDSOUT is identical to the checking function of the current path switching circuit 30 for the leakage current detecting inverter INVL and the wire 41.

Figure 9:
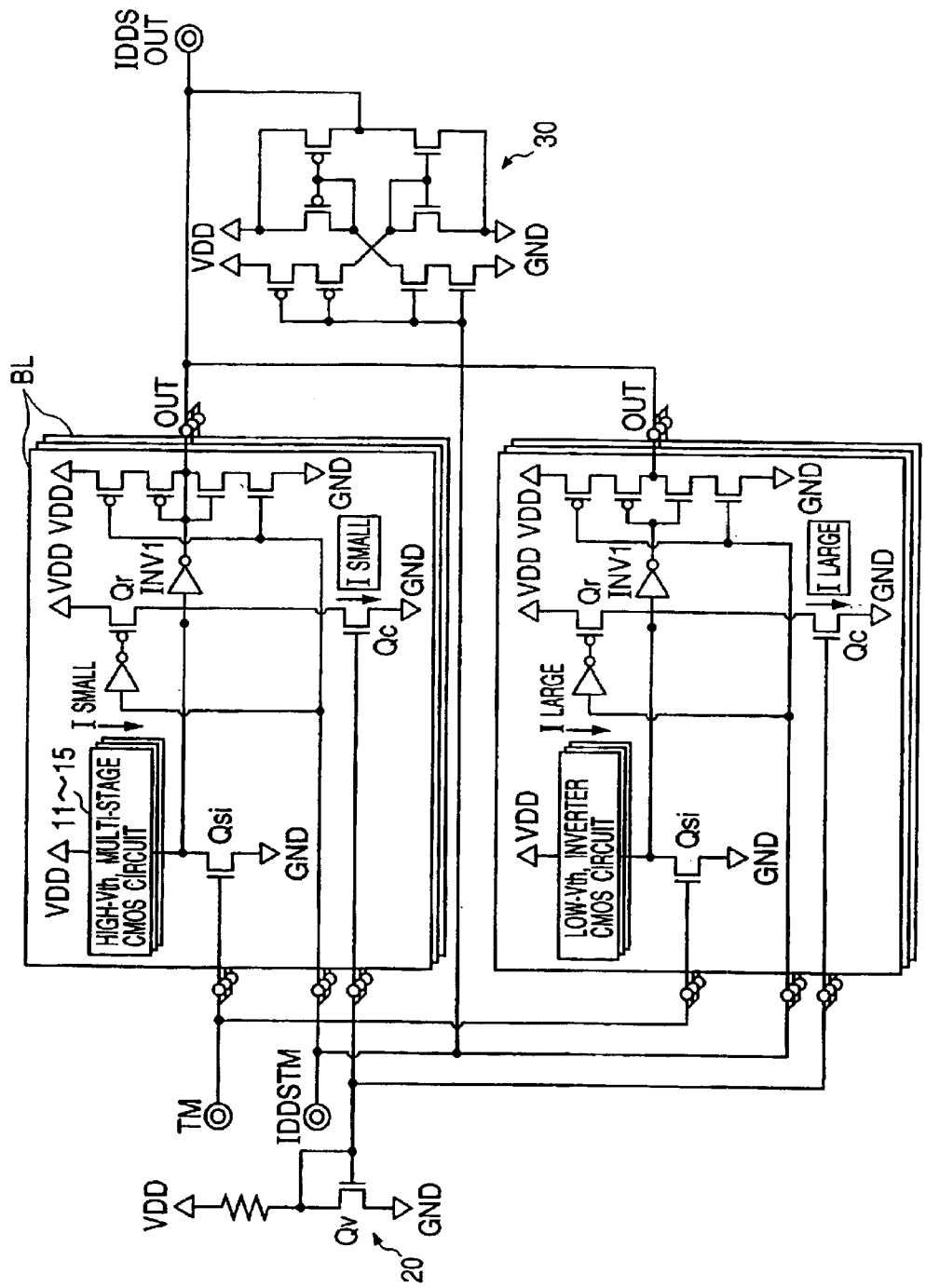
FIG. 9 is a block diagram showing a variant of the embodiment of FIG. 6.

FIG. 9 shows a variant of the embodiment of FIG. 6 with the addition of a self-check circuit which verifies the normality of the function of the leakage current detecting circuit provided for each block. This embodiment is designed to optimize the current which flows through the constant current sourcing MOSFET Qc of the leakage current detecting circuit provided for each functional block BL.

Figure 10A:
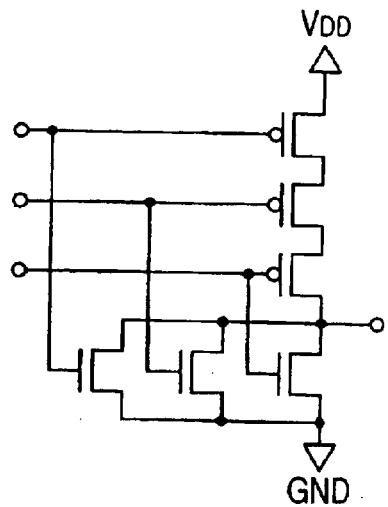
FIG. 10(A) is a schematic diagram showing an example of a circuit having a small allowable leakage current.
Figure 10B:
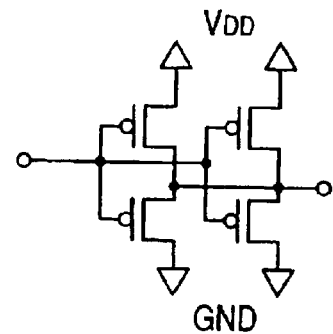
FIG. 10(B) is a schematic diagram showing an example of a circuit having a large allowable leakage current.
Figure 11:
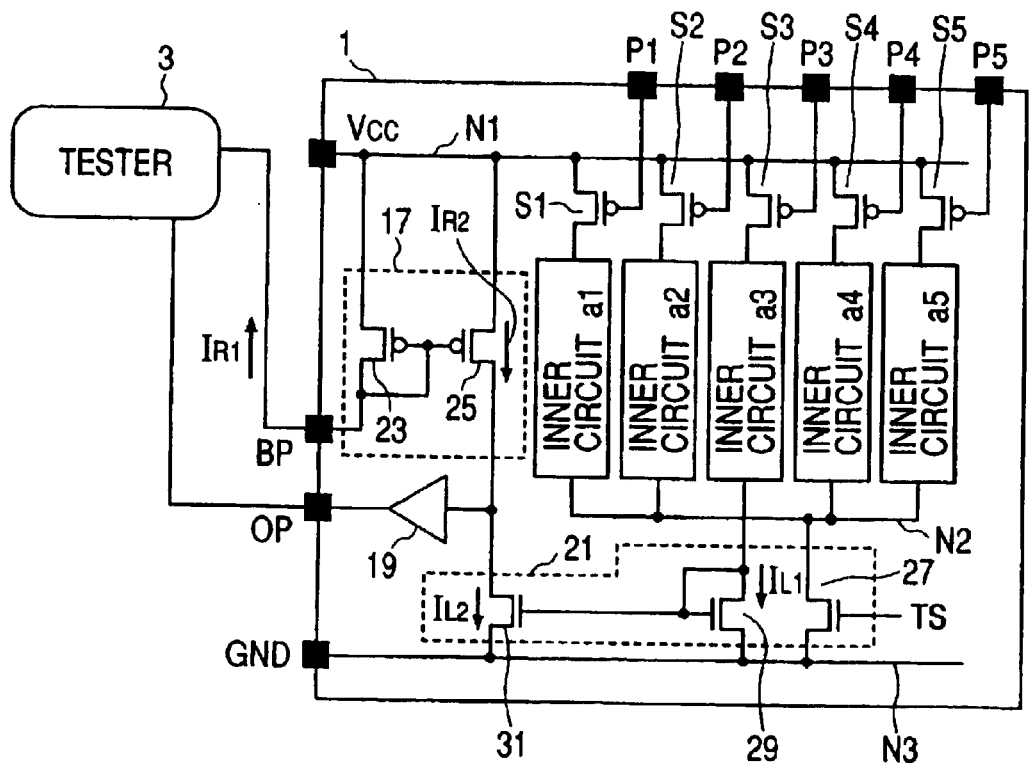
FIG. 11 is a block diagram showing an example of a conventional leakage current detecting circuit.

There are two cases of a CMOS-LSI, of which one is a CMOS circuit for leakage current detection having a large absolute value of the threshold voltage of MOSFETs or a circuit with a small allowable leakage current due to a large number of stages of tandem MOSFETs, as shown in FIG. 10(A), and the other is a CMOS circuit having a small absolute value of the threshold voltage of MOSFETs or a circuit with a large allowable leakage current due to a small number of stages of tandem MOSFETs, as shown in FIG. 10(B). The circuit of FIG. 10(A) is a 3-input NOR gate circuit, and the circuit of FIG. 10(B) is an inverter.

This embodiment is designed such that the current flowing through the constant current sourcing MOSFET Qc is made smaller for a functional block including CMOS circuits with a small allowable leakage current, while the current flowing through the constant current sourcing MOSFET Qc is made larger for a functional block including CMOS circuits with a large allowable leakage current. Based on this arrangement, it becomes possible to gain a leakage current detection sensitivity without increasing the number of segment blocks unnecessarily.

A way of setting a different current flowing through the constant current sourcing MOSFET Qc of each functional block is to set the ratio between the W/L (gate width to gate length) of the MOSFET Qv of the constant voltage source 20 in current-mirror connection with the constant current sourcing MOSFET Qc and the W/L of the constant current sourcing MOSFET Qc appropriately depending on the intended current value. Specifically, the W/L of constant current sourcing MOSFET Qc is made smaller for a small current of the MOSFET Qc, and it is made larger for a large current of the MOSFET Qc.

Although in the embodiment of FIG. 9, the constant voltage source 20 for supplying a bias voltage to the constant current sourcing MOSFET Qc is provided in common to all functional blocks, an alternative arrangement is to provide a constant voltage source 20 of a bias voltage for each functional block separately. In this case, it is possible to design the same constant current sourcing MOSFET Qc for all blocks and set the W/L-of the MOSFET Qv of the constant voltage source 20 in current-mirror connection with the constant current sourcing MOSFET Qc variably depending on the intended current value.

Although the present invention has been explained in connection with specific embodiments, the invention is not confined to the foregoing embodiments, but can be altered obviously in various ways without departing from the essence of the invention. For example, the constant voltage source 20 included in the chip may be provided outside of the chip, with the voltage Vc to be applied to the gate terminal of the constant current sourcing MOSFET Qc of the leakage current detecting circuit being supplied from the outside.

Although in the foregoing embodiment, each block current is adjusted in terms of the ratio of gate widths based on the current-mirror connection of the constant current sourcing MOSFET Qc in each block with the MOSFET Qv of the constant voltage source 20, in an alternative arrangement, instead of having a current-mirror circuit, it is possible to apply a different control voltage Vc to the gate terminal of the constant current sourcing MOSFET Qc in each block so that each block has an intended current value. The control voltage Vc for each block may be supplied from the outside of the chip, or may be produced within the chip based on the provision of a voltage-division resistor circuit.

Although the present invention has been explained mainly in the case of application of the invention to a CMOS-LSI, which is the background utilization field of the present invention, the invention is not confined such a device, but can be used for integrated circuits.

What is claimed is:
1. A semiconductor integrated circuit having a plurality of blocks and operating in a first mode or a second mode, each of said blocks comprising a MOS circuit, a switch circuit which is connected between said MOS circuit and a certain potential, and a leakage current detecting circuit which is connected to the connection node of said MOS circuit and said switch circuit and operating in said first mode to detect a leakage current flowing through said MOS circuit, said semiconductor integrated circuit further including a control circuit which operates on said switch circuits of said blocks to become conductive or non-conductive selectively.

2. A semiconductor integrated circuit according to claim 1, wherein said MOS circuit comprises a CMOS circuit.

3. A semiconductor integrated circuit which is segmented into a plurality of blocks, with switching transistors being connected between CMOS circuits in said blocks and a ground point and adapted to shut off, by being controlled by respective test mode control signals, the currents flowing through said CMOS circuits, said semiconductor integrated circuit including leakage current detecting circuits individually for said blocks which can detect leakage currents flowing through said CMOS circuits when said switching transistors are turned off, said switching transistors being adapted to turn on or off the currents flowing through said CMOs circuits in accordance with individual operation control signals so that the power consumption of each block can be reduced in a state of normal operation.

4. A semiconductor integrated circuit according to claim 3 further which implements a logic operation for said test mode control on control signals to produce signals to be applied to said switching transistors.

5. A semiconductor integrated circuit according to claim 3 further including a control means which produces operation control signals for controlling said switching transistors.

6. A semiconductor integrated circuit according to claim 4 further includes a control means which produces operation control signals for controlling said switching transistors.

* * * * *